United States Patent [19]

Carlson et al.

[11] 4,445,966

[45] May 1, 1984

[54] METHOD OF PLASMA ETCHING OF FILMS CONTAINING CHROMIUM

[75] Inventors: Robert J. Carlson, Brooklyn Park; Daniel W. Youngner, Maple Grove, both of Minn.

[73] Assignee: Honeywell Inc., Minneapolis, Minn.

[21] Appl. No.: 505,624

[22] Filed: Jun. 20, 1983

[51] Int. Cl.³ .......................... C23F 1/02; B44C 1/22; C03C 15/00; C03C 25/06
[52] U.S. Cl. .................................. 156/643; 156/646; 156/656; 156/659.1; 204/192 E; 252/79.1
[58] Field of Search ............ 156/643, 646, 656, 659.1, 156/345, 664; 252/79.1; 204/164, 192 E, 298; 427/38, 39

[56] References Cited

U.S. PATENT DOCUMENTS

| | | | |
|---|---|---|---|
| 3,951,709 | 4/1976 | Jacob | 156/643 |
| 4,115,184 | 9/1978 | Poulsen | 156/626 |
| 4,160,691 | 7/1979 | Abolafia | 156/664 |
| 4,229,247 | 10/1980 | Chiu et al. | 156/646 X |

*Primary Examiner*—William A. Powell
*Attorney, Agent, or Firm*—Stephen W. Buckingham

[57] ABSTRACT

A method of etching a thin film containing chromium using fluorine or a fluorine containing compound without leaving an electrically conductive residue is described.

22 Claims, 3 Drawing Figures

METHOD OF PLASMA ETCHING OF FILMS CONTAINING CHROMIUM

The present invention relates to plasma etching of thin films containing chromium and silicon and more particularly to the use of fluorine or fluorine containing compounds and oxygen to perform such etching.

BACKGROUND OF THE INVENTION

In the field of semiconductor integrated circuits, electrical conductor patterns may be deposited on the surface of an integrated circuit chip. Such conductors are used to electrically connect various integrated circuit structures within the chip and as contact pads for forming electrical connections with circuitry external to the chip. Likewise electrically resistive materials such as polycrystalline silicon may be provided on the surface of a chip to provide integrated resistors for use with the integrated circuit. Such conductors or resistors may be formed by providng a film on the surface of the chip. The film is then etched so that it is removed in all areas except for those where the conductor or resistor is to be provided. Commonly this etching is performed by what is known as a barrel or plasma etch. One etchant which may be used for such plasma etching is a mixture of $CF_4$ and $O_2$. This etchant is often preferred because it is safer to work with than most other etchants and less damaging both to the processing equipment and to the semiconductor materials on which the films have been formed.

Under some circumstances fluorine containing etchants cannot be used. One such circumstance is the inclusion of chromium, a common element used in such conductive or resistive films, either alone or in conjunction with other elements in the film to be etched. When chromium is used in such a film, typically a chlorine containing etchant is used. This is because the exposure of chromium to a fluorine containing plasma will tend to cause a chromium fluoride layer to form. Such a chromium fluoride layer is nonvolatile at typical etching temperatures and blocks etching. Therefore, after the chromium fluoride layer forms no further etching occurs and portions of the film which were to have been removed are only incompletely removed. Such incomplete etching causes electrical short circuits between portions of the film which were to have been retained. Furthermore chromium fluoride lacks the stability required to insure that it will not later undergo chemical changes leaving an electrically conductive residue. Therefore traces of chromium fluoride left on the chip surface could lead to undesirable electrical short circuits.

SUMMARY OF THE INVENTION

The present invention allows the use of fluorine or fluorine containing compounds to etch films containing chromium. The key step in the process is the preheating of the film to be etched prior to the etching process.

DETAILED DESCRIPTION OF THE PREFERRED EMBODIMENTS

In the preferred embodiment of the present invention a film composed of chromium/silicon or chromium/nitrogen/silicon is etched using an etchant composed of $CF_4$ and $O_2$. The invention is not limited to these particular substances, however. Other chromium containing films could be etched and other fluorine and oxygen containing etchants could be used. Furthermore, in the preferred embodiment the film to be etched is formed on a thin layer of $SiO_2$ which covers a silicon substrate. Typically the silicon substrate will contain integrated circuit structures previously formed. Other substrate materials may also be used, however.

Figure 1:
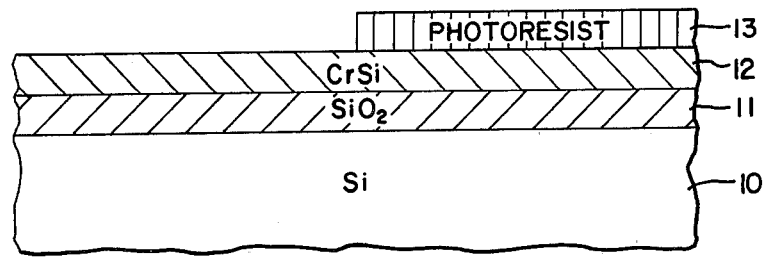
FIG. 1 is a cross sectional view of a typical integrated circuit structure with a chromium containing film, prior to etching.

FIG. 1 illustrates a typical structure including a chromium containing film prior to etching. A silicon substrate 10 typically has various electronic devices formed or partially formed therein. A thin layer of dielectric, typically $SiO_2$, 11 is formed on one surface of substrate 10. A layer of Chromium/Silicon 12 is formed covering $SiO_2$ layer 11. A layer of a photoresist material is then formed covering Chromium/Silicon layer 12. The photoresist layer is exposed and developed leaving photoresist structure 13, as shown in FIG. 1. The photoresist structure 13 covers those portions of Chromium/Silicon layer 12 to be retained, but does not cover those regions of Chromium/Silicon layer 12 to be removed by etching. Although FIG. 1 shows the use of a photoresist, other types of masking materials may be used. For example, electron beam sensitive resists might be used instead of photosensitive resists. In another embodiment an aluminum film is used as an etch resist. When aluminum is used it typically is applied a uniform film and etched using a photoresist to delineate areas to be retained. The aluminum is then used as an etch resist for underlying Chromium/Silicon layer 12.

Figure 2:
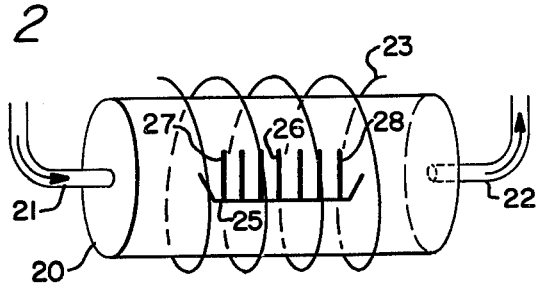
FIG. 2 is a drawing of a typical etching chamber used in a plasma etch.

The structure of FIG. 1 is placed in the reaction chamber of a plasma etching apparatus. Such an apparatus is shown in FIG. 2. An etching chanber 20 has a gas inlet 21 and outlet 22. Also included is electrical coil 23. A wafer tray 25, typically containing a plurality of semiconductor wafers, such as wafer 26, is inserted into chamber 20 and chamber 20 is sealed. Each wafer inserted into chamber 20 typically includes a film to be etched, although dummy wafers 27 and 28 may be used on the ends of wafer tray 25. Dummy wafers 27 and 28 are used because of nonuniform etching often associated with the wafers on each end of tray 25. Air is removed from reaction chamber 20 by pumping through outlet 22 until a pressure of approximately 30 mtorr is reached. Nitrogen is then introduced through inlet 21 at a flow rate which will bring the pressure to approximately 0.4 torr. A nitrogen plasma is then established by a radio frequency electrical excitation of the nitrogen gas. This excitation is accomplished by means of an electrical current established in coil 23 at a power of approximately 200 watts. The exact power required will vary with the size of chamber 20. Typically the excitation is at a frequency of about 13.56 MHz. This nitrogen plasma is used to preheat reaction chamber 20 and the materials therein. The plasma is maintained until the temperature of the chamber, and hence the films, reach the range of 35° C. to 100° C. The exact temperature which should be used is determined by the composition and the thickness of the film to be etched. If the temperature chosen is too low etching will not occur, while if the temperature is too high excessive undercutting beneath the photoresist layer will occur. If the film to be etched is 1000 Å thick the chamber should be preheated to approximately 70° C.

Following the preheating the electrical current is turned off. The nitrogen is then removed from reaction chamber 20, again by pumping through outlet 22 until a pressure of approximately 30 mtorr is reached. The etchant is then introduced into the reaction chamber through inlet 21 at a flow rate which will produce a pressure between 0.2 and 0.7 torr. Preferably a pressure of approximately 0.4 torr is established. In the preferred embodiment the etchant is 92% $CF_4$ and 8% $O_2$. Again, a plasma is established by an RF current established in coil 23 typically at 13.56 MHz, with power in the range of 150 to 300 watts. Preferably, a power of 200 watts is used. The etching step will take approximately three and one-half to five minutes to be completed. The exact time length during which the etching occurs is not critical. This is because, as will be explained below, the etching procedure is self-passivating so that extended etching times will not typically cause more undercutting than would occur with the minimum etching time.

Figure 3:
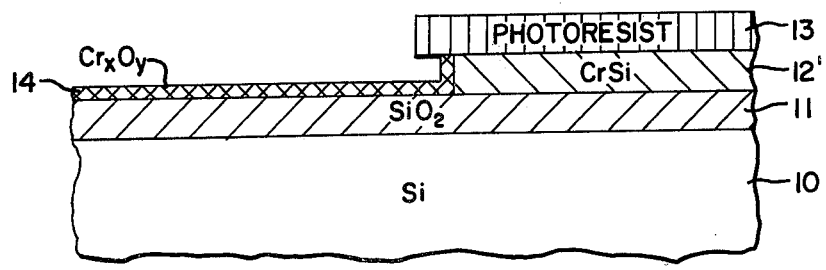
FIG. 3 is a cross sectional view of the structure of FIG. 1 following etching according to the invention.

FIG. 3 shows the structure of FIG. 1 following the etching step. Substrate 10, $SiO_2$ layer 11, and photoresist layer 13 remain unchanged from FIG. 1. Following the etching step Chromium/Silicon layer 12 of FIG. 1 is reduced in size to form Chromium/Silicon region 12' of FIG. 3. Furthermore, the etching process forms a chromium oxide layer 14. Typically chromium oxide layer 14 will include $Cr_xO_y$, but other species are likely to be present also. Therefore, chromium oxide layer 14 is said to be of $Cr_xO_y$. Chromium oxide is impervious to the etching process. Therefore, the formation of chromium oxide layer 14 along the side wall of Chromium/Silicon region 12' prevents excessive undercutting even when extended etching times are used.

As shown in FIG. 3 chromium oxide layer 14 also extends along the surface of $SiO_2$ layer 11, as well as along the sidewall of Chromium/Silicon region 12'. Those skilled in the art will perceive that, if $Cr_xO_y$ layer 14 forms before the etching is complete, bridges of electrically conductive material may remain between $Cr_xO_y$ layer 14 and $SiO_2$ layer 11. These bridges could cause undesired electrical short circuits among various Chromium/Silicon regions which are retained such as Chromium/Silicon layer 12'. Because the amount of etching which occurs before $Cr_xO_y$ layer 14 forms and stops the etching is determined by the temperature to which the film is preheated, the preheating temperature must be determined by the thickness of the film to be etched. As the preheating temperature is increased, thicker films may be etched, but, at the same time, more undercutting beneath photoresist layer 13 will result. Preferably the temperature to which the system is preheated will be high enough to allow complete etching of the portion of Chromium/Silicon film 12 which is to be removed, but low enough to minimize undercutting beneath photoresist layer 13.

Following the etching process, photoresist layer 13 is removed by known processes. If no further processing of $SiO_2$ layer 11 or silicon substrate 10 is required then the chromium oxide layer 14 may remain in place. This is because chromium oxide is a nonconductor of electricity and therefore will not permit any unwanted electrical currents. If further processing of either $SiO_2$ layer 11 or silicon substrate 10 is desired part or all of chromium oxide layer 14 may be removed by known wet chemical etching processes. One etchant which may be used to remove $Cr_xO_y$ layer 14 is a ceric sulfate solution.

As described above the preheating of the etching chamber is accomplished through the use of a nitrogen plasma after the substrates, including the films to be etched, have been placed therein. In an alternative embodiment the etching chamber may be preheated with a plasma prior to the insertion of the articles to be etched. In this case any plasma, even the etchant itself, may be used for the preheating. After the preheating, the chamber is opened and the articles to be etched are quickly inserted. The films to be etched will quickly come to thermal equilibrium with the atmosphere in the chamber, providing the desired preheating to the films. The etching may then proceed as described above. This procedure provides the advantage that only one species of plasma need be used. A disadvantage lies in the fact that the chamber is opened between the preheating and etching steps allowing gas from the external atmosphere to enter the chamber. As the amount of such gas entering the chamber will vary, as will the temperature and humidity of that gas, the exact temperature to which the films to be etched and the chamber are preheated is less controllable. Therefore, although this embodiment of the invention will provide a satisfactory result, the use of a nitrogen plasma, as described above, is preferred.

In a second alternative embodiment the etching chamber may be preheated by means other than the use of a plasma. For example, an electric heating coil might be used. Although this embodiment avoids the problem of unpredictable preheating cited above, it typically requires more energy than the use of a plasma. Additionally, most existing etching apparatuses would require retrofitting to allow such a process. For these reasons the use of a nitrogen plasma is again preferred.

The embodiments of the invention in which an exclusive property or right is claimed are defined as follows:

1. A method of etching a film containing chromium and silicon in an etching chamber, said method comprising:
   preheating said film;
   filling said etching chamber with an etchant gas including fluorine and oxygen while said film is contained therein; and
   providing a radio frequency electrical excitation to said etchant gas.

2. The method of claim 1 wherein said etching chamber is preheated to a temperature in the range 35° C. to 100° C.

3. The method of claim 2 wherein said film is preheated to a temperature of approximately 70° C.

4. The method of claim 1 wherein said etchant gas is maintained at a pressure in the range 0.2 to 0.7 torr in said etching chamber.

5. The method of claim 4 wherein said etchant gas includes $CF_4$ and $O_2$.

6. The method of claim 5 wherein said film is preheated to a temperature in the range 35° C. to 100° C.

7. The method of claim 6 wherein said film is preheated to a temperature of approximately 70° C.

8. The method of claim 1 wherein said radio frequency electrical discharge is in the range 150 watts to 300 watts.

9. The method of claim 8 wherein said etchant gas includes $CF_4$ and $O_2$.

10. The method of claim 9 wherein said film is preheated to a temperature in the range 35° C. to 100° C.

11. The method of claim 9 wherein said film is preheated to a temperature of approximately 70° C.

12. The method of claim 1 wherein said preheating is accomplished by a plasma including nitrogen, said plasma being produced in said etching chamber.

13. The method of claim 12 wherein said film is preheated to a temperature in the range 35° C. to 100° C.

14. The method of claim 13 wherein said film is preheated to a temperature of approximately 70° C.

15. The method of claim 12 wherein said etchant gas includes $CF_4$ and $O_2$.

16. The method of claim 15 wherein said film is preheated to a temperature in the range 35° C. to 100° C.

17. The method of claim 16 wherein said etchant gas is maintained at a pressure in the range 0.2 to 0.7 in said etching chamber.

18. The method of claim 17 wherein said electrical discharge is in the range 150 watts to 300 watts.

19. The method of claim 18 wherein said film is preheated to a temperature of approximately 70° C.

20. A method of etching a film including chromium, silicon, and nitrogen, said method comprising:
    placing said film in an etching chamber;
    evacuating said etching chamber;
    introducing nitrogen gas into said etching chamber;
    providing a first radio frequency electrical excitation to said nitrogen gas said excitation being maintained until said film reaches a temperature in the range 35° C. to 100° C.;
    removing said nitrogen gas from said etching chamber;
    introducing an etchant gas containing $CF_4$ and $O_2$ into said etching chamber; and
    providing a second radio frequency electrical excitation to said etchant gas.

21. The method of claim 20 wherein said etchant gas is maintained at a pressure in the range 0.2 to 0.7 torr during said second radio frequency electrical discharge.

22. The method of claim 21 wherein said radio frequency electrical discharge is in the range of 150 watts to 300 watts.

* * * * *